(12) United States Patent
Okazaki et al.

(10) Patent No.: US 6,291,031 B1
(45) Date of Patent: Sep. 18, 2001

(54) METHOD FOR PREPARING OPTICAL RECORDING MEDIUM AND PREPARATION APPARATUS THEREFOR

(75) Inventors: Sadayuki Okazaki, Katano; Toshiaki Kunieda, Minoo; Toshibumi Kamiyama, Tsuyama, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/381,677

(22) PCT Filed: Jan. 25, 1999

(86) PCT No.: PCT/JP99/00262

§ 371 Date: Sep. 23, 1999

§ 102(e) Date: Sep. 23, 1999

(87) PCT Pub. No.: WO99/38159

PCT Pub. Date: Jul. 29, 1999

(30) Foreign Application Priority Data

Jan. 27, 1998 (JP) .................................................. 10-013836

(51) Int. Cl.[7] ...................................................... G11B 7/26
(52) U.S. Cl. ...................... 427/593; 427/166; 427/255.6; 427/296; 118/716; 118/718; 118/730
(58) Field of Search ..................................... 427/593, 166, 427/255.6, 296; 118/716, 718, 730, 726, 727; 430/128, 270.15

(56) References Cited

U.S. PATENT DOCUMENTS 3,990,894 * 11/1976 Kinoshita et al. ................... 427/109
4,543,275 * 9/1985 Akashi et al. ..................... 427/255.6
4,557,868 * 12/1985 Page et al. ....................... 260/245.89
5,230,923 * 7/1993 Hirokawa et al. ................. 427/255.5

FOREIGN PATENT DOCUMENTS

| 57-212634 | * | 12/1982 | (JP) . | |
|---|---|---|---|---|
| 59-144056 | * | 8/1984 | (JP) . | |
| 5-5894 | | 10/1984 | (JP) . | |
| 60-150241 | * | 8/1985 | (JP) . | |
| 59-177365 | * | 10/1985 | (JP) . | 427/255.6 |
| 62-077455 | * | 4/1987 | (JP) . | 427/255.6 |
| 02-003125 | * | 1/1990 | (JP) . | |
| 06-088214 | * | 3/1994 | (JP) . | |
| 6-211995 | | 8/1994 | (JP) . | |
| 10-188354 | | 7/1998 | (JP) . | |

OTHER PUBLICATIONS

G.D. Parfitt, "Dispersion of Powders in Liquids", pp. 386–399, 1973.*

* cited by examiner

Primary Examiner—Martin Angebranndt
(74) Attorney, Agent, or Firm—Wenderoth, Lind & Ponack, L.L.P.

(57) ABSTRACT

In a pigment depositing device for forming a recording layer of an optical recording medium, there is used an organic pigment of powder state, in which the diameter of each of particles of the organic pigment is uniform. In consequence, occurrence of splash is prevented when the organic pigment is heated by an electrical heater so that it is prevented that the particles of the organic pigment adhere to a substrate. Moreover, fluidity of the organic pigment in an organic pigment feeding device is raised so that the organic pigment is smoothly fed.

11 Claims, 6 Drawing Sheets

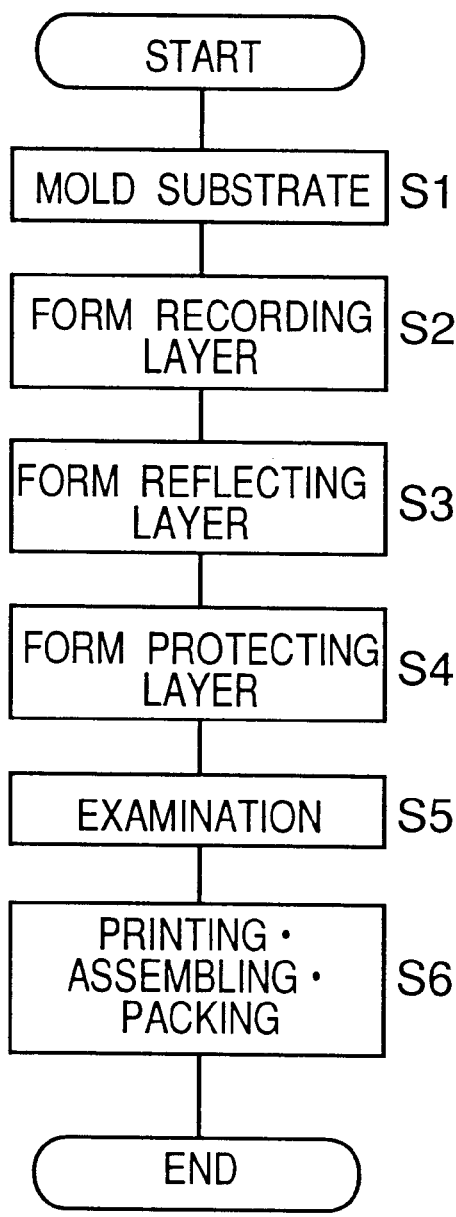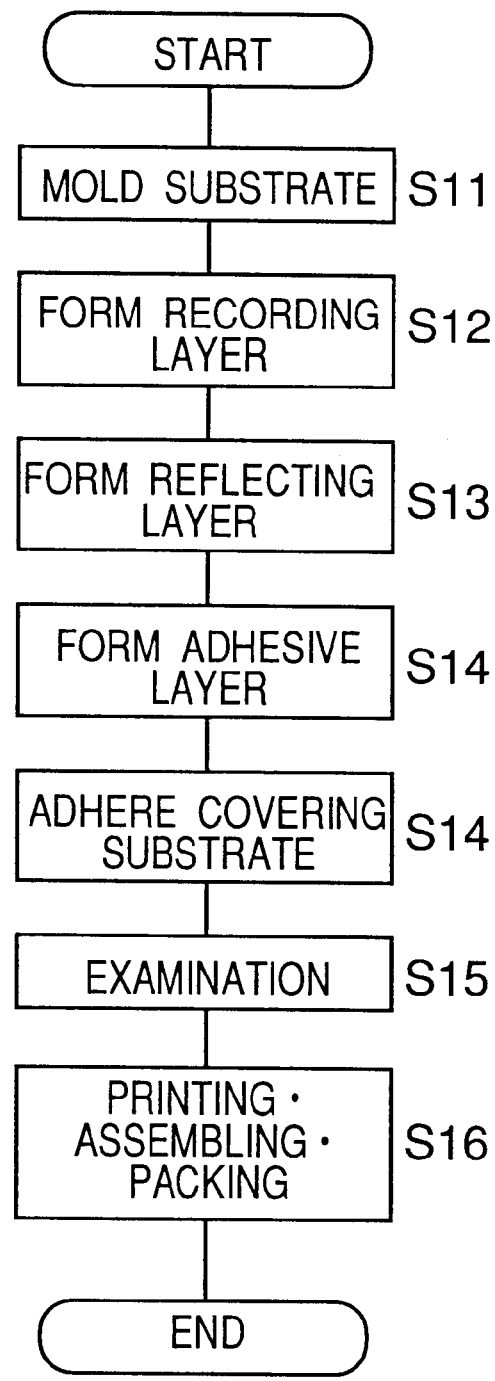

Fig.8A
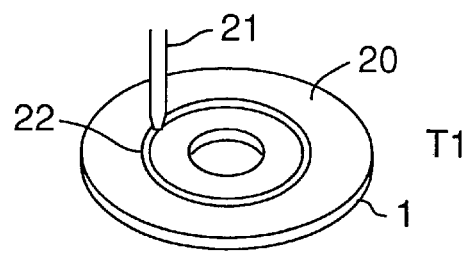
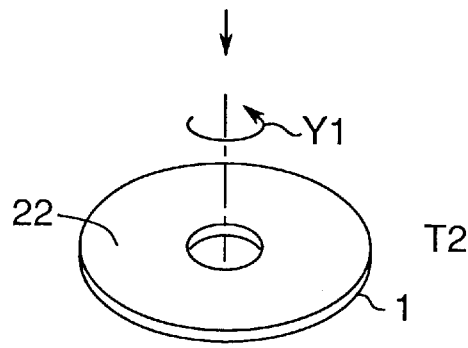
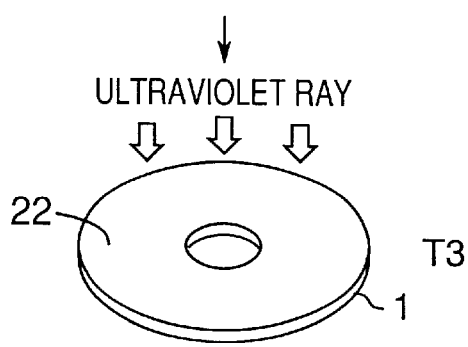
Fig.8B
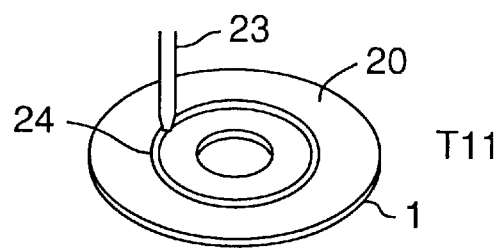
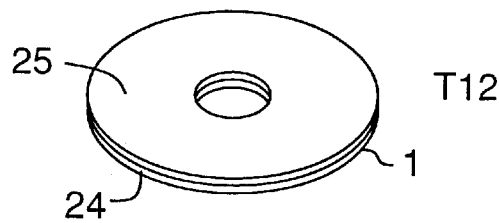
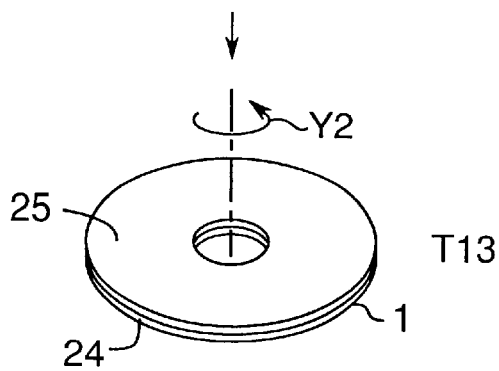
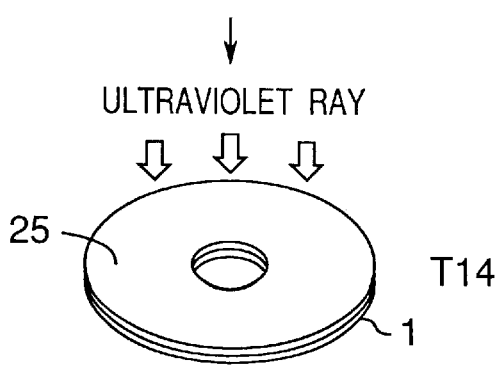

METHOD FOR PREPARING OPTICAL RECORDING MEDIUM AND PREPARATION APPARATUS THEREFOR

This application is a 371 of PCT/JP99/00262 filed Jan. 25, 1999.

TECHNICAL FIELD

The present invention relates to a method of and an apparatus for manufacturing an optical recording medium.

BACKGROUND ART

In recent years, an optical recording medium such as an optical disk or the like has been rapidly prevailing as an external memory for a personal computer, a word processor, a large scale computer system or the like. As compared with a magnetic recording medium such as a magnetic disk, which has been widely used up to now, the above-mentioned optical recording medium has such various advantages that it is possessed of a larger memory capacity, a higher durability against disturbances due to vibration, electromagnetic field or the like, and a longer lifetime.

Thus, as the optical recording medium described above, there may be generally cited an optical recording medium for playback use only, an optical recording medium of write-once type and a rewritable optical recording medium. Among those, the optical recording medium of write-once type, for example a compact disk of write-once type (CD-R) or a DVD of write-once type (DVD-R), has such an advantage that it is suitable for recording or preserving particularly important information, since the user can write arbitrary information into it only once, while it is not feared that the information may be rewritten.

Hereupon, a "DVD" is referred to an optical recording medium which can record various digital signals with high density using a high efficiency encoding technique (data compressing technique) such as MPEG 2 or the like. In general, although it is much used for recording video signals, its use is not restricted to the use for recording the video signals so that it may be widely used, for example, as an external memory for a computer or the like. Hereupon, although the wording of "DVD" is not formally any abbreviation of a specified term, it may be sometimes referred to the abbreviation of the term "Digital Versatile Disk" by usage.

In general, the above-mentioned optical recording medium of write-once type, for example the CD-R, is fundamentally manufactured in accordance with the following procedure. That is, at first, a disk-shaped (doughnut-shaped) substrate is made using a transparent plastic material (for example, polycarbonate resin) or the like by means of injection molding or the like. Hereupon, during the injection molding process, a groove portion for tracking guide is formed on one of the two spreading surfaces of the substrate. Then, on the spreading surface of the substrate, on which the groove portion has been formed, there are formed a recording layer including organic pigments and a reflecting layer made of metal materials by turns. Moreover, on the reflecting layer, a protecting layer for protecting the reflecting layer is formed.

Hereupon, in the case of manufacturing the DVD-R, a covering substrate is adhered onto the reflecting layer using an adhesive.

Meanwhile, in the above-mentioned optical recording medium of write-once type, the recording layer must be formed in a very thin state (for example, the thickness of the layer must be less than or equal to 0.3 µm). Thus, in the conventional process for manufacturing the optical recording medium, the recording layer is formed in such a manner that an organic pigment is applied on the spreading surface of the substrate, on which the groove portion has been formed, by means of spin coating operation or the like. However, in the above-mentioned conventional process for forming the recording layer using spin coating operation or the like, there is such a problem that it is difficult to form the recording layer of sufficiently thin state.

Thus, the inventors of the present application have developed a process for forming a sufficiently thin recording layer using the vapor deposition process which has been conventionally used in other technical fields (for example, fields for manufacturing a color filter, a semiconductor or the like). Hereupon, in the conventional vapor deposition process, for example, there is performed such a procedure including the steps of getting a substrate holder to hold the substrate using a planetary jig within a vacuum device while disposing a vaporizing source with a material for vapor deposition beneath the substrate, heating the material for vapor deposition to vaporize (sublimate) while getting the substrate holder to self-rotate and revolve, and getting vapor of the material for vapor deposition to deposit on the surface of the substrate (for example, see Japanese Patent Publication No. H8-13572).

However, if the above-mentioned conventional vapor deposition process is used for forming the recording layer of the optical recording medium of write-once type, when the organic pigment of powder state is heated, there may occur such a phenomenon that organic pigment particles having relatively small size fly apart due to their thermal expansion or their local rapid vaporization etc., the phenomenon being called splash. Thus, if the organic pigment particles, which have flied apart due to splash, adhere to the spreading surface on which the recording layer is to be formed, the recording layer is formed in the state that it wraps up the organic pigment particles. In this case, there may occur such a problem that error rate of the optical recording medium after completion of the manufacturing process is lowered (deteriorated).

Thus, in order to prevent splash described above, there has been proposed a procedure for forming the recording layer in which a pre-solidified organic pigment is used (see Japanese Laid-Open Patent Publication No. S61-105508). However, when the pre-solidified organic is used as described above, there may occur such a problem that heat conductivity is raised too excess during the heating process of the organic pigment so that the organic pigment is easily carbonized, in consequence its residue is formed so much. Hereupon, there may be thought out such a procedure as to prevent splash by using an organic pigment of pellet type. However, in this case also, there may occur such a problem that the organic pigment is easily carbonized as same as the case of using the above-mentioned pre-solidified organic pigment so that its residue is formed so much.

Further, in the conventional process for forming the recording layer by means of vapor deposition, there may be used a continuous feeding apparatus for feeding the organic pigment, which is designed to continuously feed the organic pigment of powder state contained in a hopper or the like at a constant flow rate to the organic pigment heater. In this case, if flowing property of the powder organic pigment in the hopper is lower, the organic pigment cannot be fed. Therefore, the inventors of the present application have continuously fed the powder organic pigment onto a belt conveyer while stirring the powder in the hopper using a screw so as to raise its fluidity.

DISCLOSURE OF INVENTION

The present invention is achieved to solve the conventional problems described above. Thus, one of the problems to be solved is to provide means, which can prevent the organic pigment particles from adhering to the substrate due to splash without causing a disadvantage such that residue of the organic pigment is increased when the recording layer of the optical recording medium is formed by vapor deposition under atmosphere of reduced pressure, in consequence the optical recording medium is possessed of better error rate. Further, another one of the problems to be solved is to provide means of simple construction, which can continuously feed the powder organic pigment at a constant flow rate to the organic pigment heater.

According to a first aspect of the present invention which has been achieved to solve the above-mentioned problems, there is provided (a) a method of manufacturing an optical recording medium in which a recording layer for recording information in such a manner that the information can be read using light, is formed on a predetermined spreading surface of a disk-shaped substrate (namely, a spreading surface on which a groove portion is formed; hereinafter it being referred to ("obverse spreading surface") by depositing an organic pigment on the obverse spreading surface under atmosphere of reduced pressure by vapor deposition, (b) characterized in that the organic pigment of powder state, in which each of powder particles has a closely resemble (uniform) particle diameter to one another, is heated to be vaporized so that the recording layer is formed by depositing vapor of the organic pigment on the obverse spreading surface of the substrate by vapor deposition. Hereupon, the organic pigment may be heated while being continuously fed to a heating position.

Hereupon, it is preferable that the particle diameter of each of the organic pigment particles is within a range of 30% upper or lower with respect to a standard particle diameter (average particle diameter).

In the method of manufacturing the optical recording medium, since the particle diameter of each of the organic pigment particles is closely resemble (uniform) to one another, occurrence of splash is prevented when the organic pigment is heated. The reason is as follows. Namely, in general, splash occurs due to ununiform heat expansion or rapid vaporization of the organic pigment particles when the particles are heated. Hereupon, if the particle diameter of each of the organic pigment particles is closely resemble, the above-mentioned ununiform heat expansion or rapid vaporization is hardly caused so that occurrence of splash is restricted or prevented. Further, splash due to joining of fine particles is also restricted. Therefore, the optical recording medium may be possessed of higher error rate.

Moreover, when the particle diameter of each of the organic pigment particles is closely resemble (uniform) as described above, flowing property of the organic pigment is raised. Thus, even if the organic pigment stored in a hopper or the like is not stirred by a screw or the like, the flow rate of the organic pigment to a heater for heating the organic pigment may be uniformed (stabilized). Therefore, rate of vapor deposition of the organic pigment is stabilized so that the thickness of the layer can be easily controlled. In consequence, the thickness of the recording layer may be uniformed. Further, the mechanism for feeding the organic pigment may be simplified.

In the above-mentioned method of manufacturing the optical recording medium, it is preferable to use the powder organic pigment in which the diameter of each of the particles is within a range of 150 to 1000 μm. The reason is that since the organic pigment particle, whose diameter is less than 150 μm, particularly tends to cause splash, it is not preferable to make the particle diameter smaller than 150 μm. Meanwhile, if the particle diameter is larger than 1000 μm, the balance against sublimation is deteriorated. Hereupon, if the feeding rate of the pigment to the heater is smaller, carbide may be produced. Meanwhile, if the feeding rate of the pigment to the heater is larger, there may be produced residue, which has not sublimated. Thus, since material efficiency is lowered in either case, it is not preferable to make the particle diameter larger than 1000 μm.

To be concrete, for example, it is practical to use the organic pigment in which the diameter of each of the particles is in a range of 200 to 300 μm, in a range of 425 to 500 μm or in a range of 500 to 600 μm.

Hereupon, the organic pigment, in which the diameter of each of the particles is uniform as described above, may be easily prepared by sieving conventional organic pigment powder having random particle diameter distribution (for example, the particle diameter being within 2 to 2000 μm) using two sieves corresponding to the objective particle diameter. For example, when there are used a sieve whose aperture diameter is 300 μm and another sieve whose aperture diameter is 200 μm, there may be obtained the organic pigment whose particle diameter is within a range of 200 to 300 μm by sieving the organic pigment particles, which have passed through the sieve whose aperture diameter is 300 μm, using the sieve whose aperture diameter is 200 μm, and then gathering the organic pigment particles remaining on the sieve.

In the above-mentioned method of manufacturing the optical recording medium, it is preferable that a rotating endless belt (ring-shaped belt) is used so that the organic pigment is arranged on the belt at a first region for feeding the materials while the organic pigment is heated so as to vaporize at a second region of the belt. In this case, the feeding rate or vaporizing rate of the organic pigment may be equalized, in consequence the thickness of the recording layer which is formed on the obverse spreading surface of the substrate may be uniformed. Further, since the organic pigment is not fed to excess, decomposition of the organic pigment due to overheat thereof is not caused so that the vapor deposition process may be successively performed for a long time.

Hereupon, the method of manufacturing the optical recording medium is particularly suitable for manufacturing an optical recording medium of write-once type, for example a compact disk of write-once type or a DVD of write-once type, into which information can be written only once by applying light onto the recording layer.

Moreover, according to the second aspect of the present invention, there is provided (a) an apparatus for manufacturing an optical recording medium in which a recording layer for recording information in such a manner that the information can be read using light, is formed on a predetermined spreading surface of a disk-shaped substrate (obverse spreading surface) by depositing an organic pigment on the obverse spreading surface under atmosphere of reduced pressure by vapor deposition, characterized in that the apparatus is provided with (b) a transporting device for transporting the organic pigment of powder state, in which each of powder particles has a closely resemble diameter to one another, (c) an organic pigment feeding device for holding the organic pigment while arranging the organic pigment on a predetermined position of the transporting device at a predetermined flow rate, and (d) an organic pigment heating device for heating the organic pigment being transported by the transporting device so as to vaporize.

Hereupon, it is preferable that the diameter of each of the organic pigment particles is within a range of 30% upper or lower with respect to a standard particle diameter (average particle diameter).

As the transporting device described above, for example, a ring-shaped belt may be used. In this case, it is preferable that the organic pigment feeding device is designed such that the organic pigment is arranged on the belt at a first region in a portion at which the outer spreading surface of the belt orients upward, the organic pigment is fed to the organic pigment heating device in the arranged state, and then the organic pigment is heated so as to vaporize at a second region.

In the apparatus for manufacturing the optical recording medium, since the diameter of each of the particles of the powder organic pigment is closely resemble (uniform) to one another, occurrence of the splash is prevented when the organic pigment is heated in the organic pigment heating device as same as the case of the above-mentioned method of manufacturing the optical recording medium so that the optical recording medium may be possessed of better error rate. Further, since the diameter of each of the particles of the powder organic pigment is closely resemble (uniform), fluidity of the powder organic pigment in the organic pigment feeding device is raised. Thus, even if the organic pigment is not stirred by a screw or the like, the organic pigment may be fed to the organic pigment heating device in such a manner that it is arranged with a constant width and thickness. In consequence, the mechanism of the organic pigment feeding device may be simplified, consequently the mechanism of the apparatus for manufacturing the optical recording medium may be simplified.

Therefore, the feeding rate or vaporizing rate of the organic pigment may be equalized, in consequence the thickness of the recording layer which is formed on the obverse spreading surface of the substrate may be easily controlled so that the thickness of the layer may be uniformed. Further, since the organic pigment is not excessively fed to the organic pigment heating device, decomposition of the organic pigment due to overheat thereof is not caused so that the vapor deposition process may be successively performed for a long time.

In the above-mentioned apparatus for manufacturing the optical recording medium, it is preferable to use the powder organic pigment in which the diameter of each of the particles is within a range of 150 to 1000 $\mu$m, for the same reason as the case of the above-mentioned method of manufacturing the optical recording medium.

To be concrete, for example, it is practical to use the organic pigment in which the diameter of each of the particles is in a range of 200 to 300 $\mu$m, in a range of 425 to 500 $\mu$m or in a range of 500 to 600 $\mu$m.

Hereupon, the apparatus for manufacturing the optical recording medium is particularly suitable for manufacturing an optical recording medium of write-once type, for example a compact disk of write-once type or a DVD of write-once type, into which information can be written only once by applying light onto the recording layer.

BRIEF DESCRIPTION OF DRAWINGS

FIG. 1A is a flowchart showing a manufacturing process of a CD-R according to the present invention. FIG. 1B is a flowchart showing a manufacturing process of a DVD-R according to the present invention.

FIG. 8A is a view showing a procedure for forming a protecting layer during the manufacturing process of the CD-R. FIG. 8B is a view showing a procedure for forming a adhesive layer and a procedure for adhering a covering substrate in the manufacturing process of the DVD-R.

BEST MODE FOR CARRYING OUT THE INVENTION

Hereinafter, embodiments of the present invention will be concretely described. At first, there will be described a method of or an apparatus for manufacturing a CD-R (compact disk of write-once type) according to the present invention.

As shown in FIG. 1A, in the manufacturing process of the CD-R according to the present invention, initially, a disk-shaped (doughnut-shaped) substrate 1 (see FIG. 2) is produced by injection molding or the like using a substantially transparent plastic material, for example polycarbonate resin or the like (Step S1). Hereupon, the shape and quality (for example, outer diameter, inner diameter, thickness, camber, eccentricity, surface bending, double-refractivity or the like.) of the substrate 1 are as same as those of a conventional CD-R.

Figure 2:
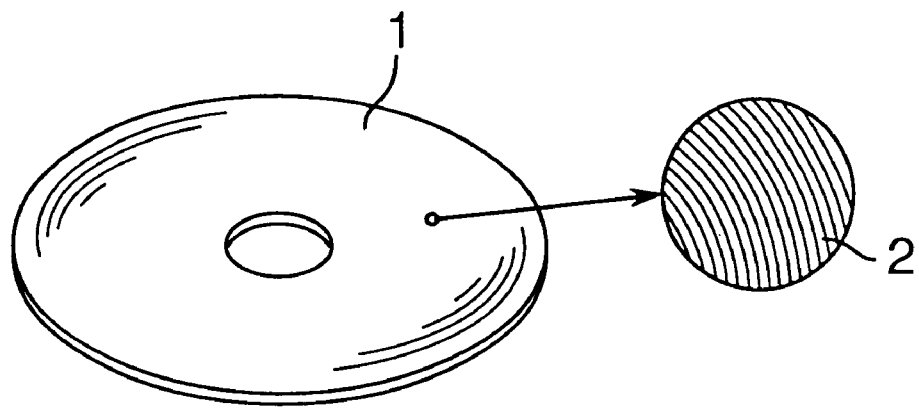
FIG. 2 is a perspective view of a substrate of the CD-R or DVD-R.
Figure 3:
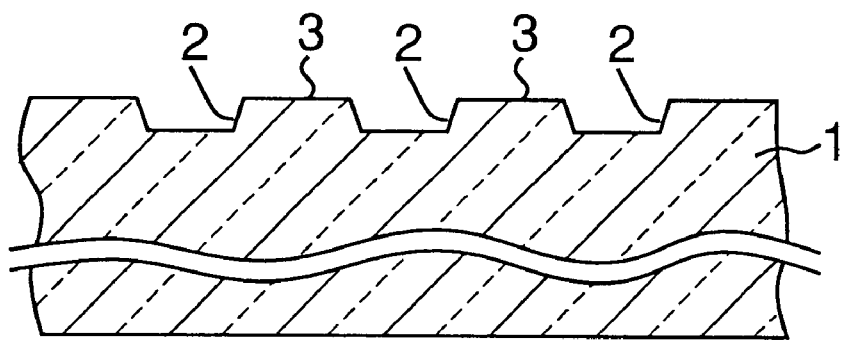
FIG. 3 is a sectional view showing a longitudinal section obtained by cutting the substrate shown in FIG. 2 in the radial direction of the substrate.

As shown in FIGS. 2 and 3, in the substrate forming step (Step S1), a spiral-shaped groove portion 2 for tracking guide use is formed on the obverse spreading surface of the substrate 1. Hereupon, the opposite-side spreading surface of the substrate 1, namely the back spreading surface is flat. The groove portion 2 is formed such that the section obtained by cutting it in the radial direction of the substrate forms a trapezoid (bottom side of the groove being narrower), its track pitch (pitch in the radial direction of the substrate) being set to about 1.6 $\mu$m. Further, if it is viewed in the radial direction of the substrate, there is formed a land portion 3 between two partial groove portions 2, which are adjacent to each other. Hereupon, the depth of the groove portion 2 is set to about 0.03 to 0.08 $\mu$m. Further, the width (width in the radial direction of the substrate) of the groove portion 2 is set to about 0.3 to 0.6 $\mu$m at the position where the depth is middle level. Meanwhile, the thickness of the substrate 1 is set to about 1.2 mm.

Next, a recording layer is formed on the obverse spreading surface of the substrate 1, namely the spreading surface on which the groove portion 2 is formed (Step S2), and further a reflecting layer is formed on the recording layer (Step S3).

Figure 4:
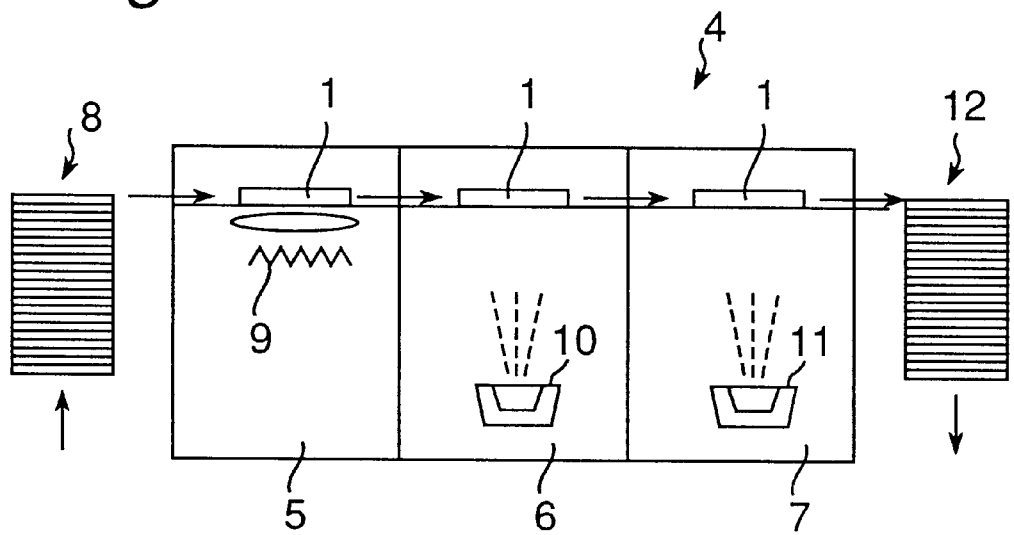
FIG. 4 is a schematic view of a vacuum treatment device for forming a recording layer and a reflecting layer on the obverse spreading surface of the substrate.

As shown in FIG. 4, the recording layer and the reflecting layer are formed in a predetermined treatment chamber in a vacuum treatment device 4, respectively. The vacuum treatment device 4 is provided with a pretreatment chamber 5, a recording layer forming chamber 6 and a reflecting layer forming chamber 7. Hereupon, the pressure in the vacuum treatment device 4 is held at a pressure lower (higher vacuum degree) than about $10^{-3}$ Torr. Further, it is particularly preferable that the pressure is lower than $10^4$ Torr.

Thus, the substrate 1 disposed on a substrate supplying position 8 is transported, in turn, to the pretreatment chamber 5 having a pretreatment device 9, to the recording layer forming chamber 6 having a pigment depositing device 10 (source of vapor deposition) and to the reflecting layer forming chamber 7 having a metal depositing device 11 so that the substrate is conducted to predetermined treatments, and then the substrate is discharged to a substrate discharging position 12.

To be concrete, in the pretreatment chamber 5, a pretreatment for raising adhesion property of the recording layer to the substrate 1 is performed onto the obverse spreading surface of the substrate 1 by the pretreatment device 9. Further, in the recording layer forming chamber 6, by the pigment depositing device 10, an organic pigment is deposited on the obverse spreading surface of the substrate 1 to which the pretreatment has been performed, thereby the recording layer composed of the organic pigment is formed.

Figure 5:
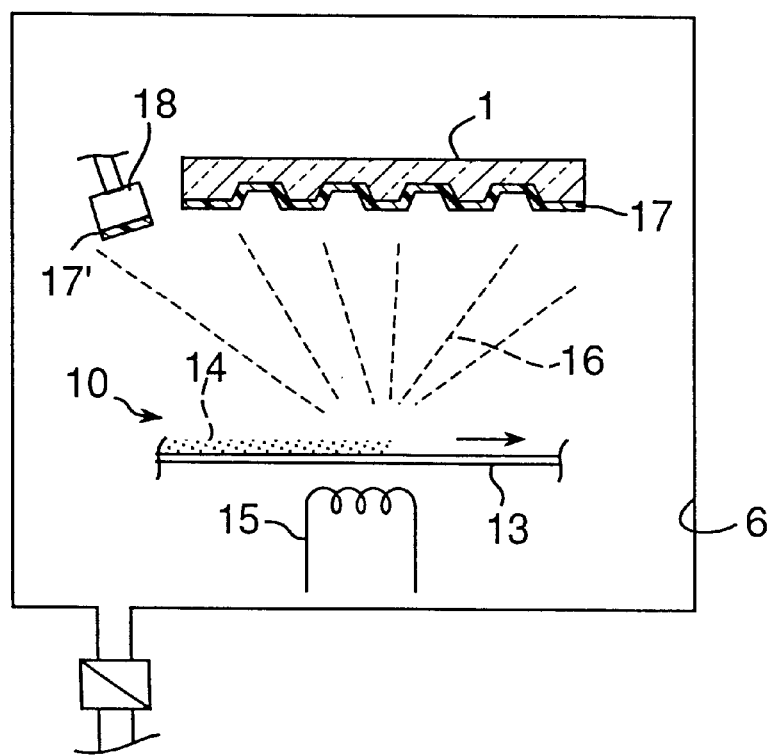
FIG. 5 is an enlarged schematic view showing a recording layer forming chamber in the vacuum treatment device shown in FIG. 4.

As shown in FIG. 5, in the recording layer forming chamber 6, the substrate 1 is held by the substrate holder (not shown) in such a manner that substantially only the obverse spreading surface is exposed outward. Hereupon, the substrate 1 is held in such a positional relationship or attitude that the both spreading surfaces are horizontal. Further, in the pigment depositing device 10 disposed in the recording layer forming chamber 6, as described after, the powder organic pigment 14 (particles of solid state) is successively transported at a constant feeding rate by a circulating ring-shaped belt 13 (endless belt) made of stainless steel so that the organic pigment 14 is heated at a predetermined position by an electrical heater 15.

Hereupon, the inner space of the recording layer forming chamber 6 is scavenged or depressurized by a vacuum pump (not shown) so that the pressure of the space is held at a pressure lower than $10^{-3}$ Torr, or lower than $10^{-4}$ Torr according to circumstances.

Thus, the organic pigment 14 heated by the electrical heater 15 is vaporized (sublimated) to become organic pigment vapor 16. The organic pigment vapor 16 diffuses in the recording layer forming chamber 6. Then, a part of the vapor is cooled on the obverse spreading surface of the substrate 1, whose temperature is approximately maintained at the room temperature, to be solidified (deposited) so that it becomes a recording layer 17 fixed on the obverse spreading surface.

Although the electrical heater 15 is used as a heating source of the organic pigment 14 here, any of heaters which are used in the present technical field may be used as the heating source. For example, a heating source utilizing radiation of light or infrared ray may be used.

Although details are not shown, the substrate 1 held by the substrate holder is self-rotated about a vertical line passing through the center portion of the substrate by a mechanism for self-rotating the substrate (not shown), while the substrate is revolved by a mechanism for revolving the substrate (not shown). The reason why the substrate 1 is self-rotated and revolved as described above, is such that the thickness of the recording layer 17 is effectively uniformed if so. Hereupon, if there exists such a circumstance that the thickness is easily uniformed, only the self-rotation may be performed, or only the revolution may be performed.

Hereupon, the thickness of the recording layer 17 is set to about 10 to 300 nm. The time required for depositing the recording layer 17 of the above-mentioned thickness is approximately from a few seconds to a few tens seconds. Hereupon, a thickness monitor 18 for monitoring the thickness of the recording layer 17 is provided in the recording layer forming chamber 6. As the above-mentioned thickness monitor 18, for example, there may be used a monitor of quartz oscillator, an optical monitor or the like.

In the step for forming the recording layer 17, the organic pigment 14 is heated up to about 100 to 500 ° C. in general, to about 200 to 400 ° C. in most cases so as to be vaporized (sublimated). Hereupon, the organic pigment 14 may be any of organic pigments, which are generally used as materials for the recording layer of the CD-R. For example, there may be used such an organic pigment material of phthalocyanine group, naphthalocyanine group, squalene group, corronium group, pyrylium group, naphthoquinone group, anthraquinone group, xanthene group, triphenylmethane group, azulene group, tetrahydrocholine group, phenanthrene group, triphenothiazine group, azo group or polymethine group.

Hereinafter, the pigment depositing device 10 disposed in the recording layer forming chamber 6 will be described more concretely.

Figure 6:
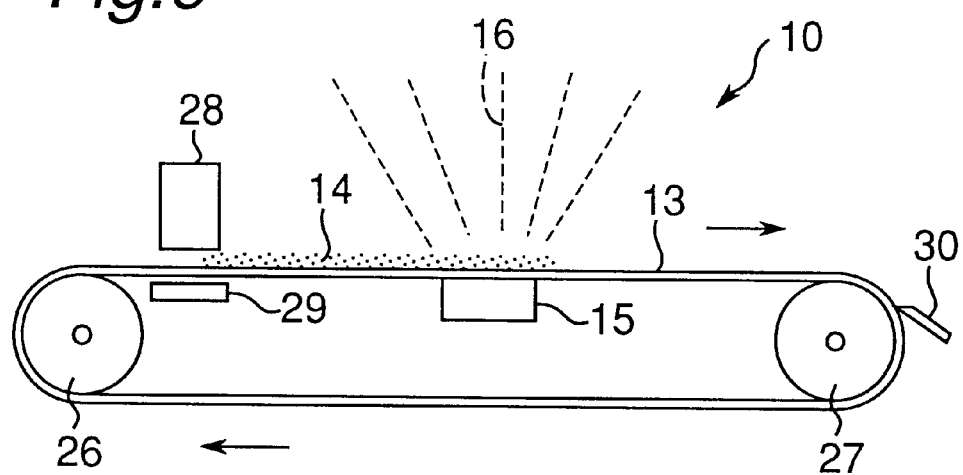
FIG. 6 is an elevation view of a pigment depositing device provided in the recording layer forming chamber shown in FIG. 5.

As shown in FIG. 6, in the pigment depositing device 10, there are provided a first pulley 26 (driven pulley) and a second pulley 27 (drive pulley), each of which can rotate about an axial line extending in the horizontal direction, respectively. Further, between the both pulleys 26,27, the above-mentioned ring-shaped belt 13 made of stainless steel (SUS) is wound. Thus, the belt 13 is driven by the both pulleys 26,27 to be rotated at a constant speed. Hereupon, the moving speed of the belt 13 is set to, for example, about 5 mm/minute.

Further, in a first region of the device, there is provided an organic pigment feeder 28 for feeding the powder organic pigment 14 onto the outer spreading surface of the belt 13 at a constant feeding rate. Hereupon, beneath the organic pigment feeder 28, there is provided an ultrasonic oscillator 29 for raising fluidity of the organic pigment 14 under the belt 13. Moreover, in a second region of the device, the above-mentioned electrical heater 15 is disposed under the belt 13. Thus, the organic pigment 14, which is arranged with a constant width and thickness on the belt 13, is successively transported by the belt 13. When the pigment is transported to the upper position of the electrical heater 15, it is heated by the electrical heater 15 so that it is vaporized to become organic pigment vapor 16. Hereupon, in the pigment 14 which has been transported to the upper position of the electrical heater 15 by the belt 13, since the diameter of each of the particles of the pigment is uniform as described after, the pigment is almost vaporized completely by the electrical heater 15 so that residue or carbide of the pigment is hardly produced.

Hereupon, although the heat source for the organic pigment 14 is disposed under the belt 13 in this embodiment, it may be disposed above the belt 13 so as to heat the organic pigment 14 from the upper side.

Further, in the pigment depositing device 10, there is provided a cleaner 30 (for example, metal brush) for cleaning the spreading surface of the belt 13 at a downstream position in comparison with the position where the electrical heater 15 is disposed. Therefore, even if residue of the organic pigment or the organic pigment which has not vaporized, adheres to the spreading surface of the belt 13, it is removed by the cleaner 30.

Hereinafter, the organic pigment 14, which is used in the pigment depositing device 10, will be described more minutely.

In the pigment depositing device 10, the powder organic pigment 14, in which the diameter of each of the pigment particles is closely resemble, namely uniform, is used. For example, the pigment, in which the particle diameter is within the range of 30% upper or lower with respect to a standard particle diameter (average particle diameter), is used. Hereupon, it is preferable that the diameter of each of the particles of the organic pigment 14 is within the range of 150 to 1000 μm. The reason is that since the organic pigment particle, whose diameter is smaller than 150 μm, particularly tends to cause splash, it is not preferable that the particle diameter is smaller than that. Further, if the particle diameter is smaller than 150 μm, the organic pigment coheres by compression to block so that it cannot be arranged (fed) onto the organic pigment feeder, in consequence it is required a countermeasure such as stirring. On the other hand, if the particle diameter is larger than 1000 μm, balance against sublimation is deteriorated. Hereupon, if the feeding rate of the pigment to the heater is smaller, carbide may be produced. Meanwhile, if the feeding rate of the pigment to the heater is larger, there may be produced residue, which has not sublimated. Thus, since material efficiency is lowered in either case, it is not preferable to make the particle diameter larger than 1000 μm. To be concrete, for example, it is practical to use the organic pigment 14 in which the diameter of each of the particles is in a range of 200 to 300 μm, in a range of 425 to 500 μm or in a range of 500 to 600 μm.

As described above, since the diameter of each of the particles of the organic pigment 14 is uniform, occurrence of splash is prevented when the organic pigment 14 is heated. That is, in general, splash occurs due to ununiform heat expansion or rapid vaporization of the particles of the organic pigment 14 when the particles are heated. Hereupon, if the diameter of each of the particles of the organic pigment 14 is uniform, the above-mentioned ununiform heat expansion or rapid vaporization is hardly caused. In consequence, occurrence of splash is restricted or prevented.

Further, when the diameter of each of the particles of the organic pigment 14 is uniform as described above, fluidity of the organic pigment 14 is raised. Thus, even if the organic pigment 14 in the organic pigment feeder 28 is not stirred by a screw or the like, it can smoothly flow so that the mechanism of the organic pigment feeder 28 may be simplified.

Hereupon, as described above, the organic pigment 14, in which the diameter of each the pigment particles is uniform, can be easily prepared by sieving conventional powder organic pigment with random particle diameter distribution (for example, particle diameter ; 2 to 2000 μm) using two sieves corresponding to the objective particle diameter.

In Table 1, there is shown a result obtained by measuring error rate, successive feeding property and playback performance with respect to some CD-R's produced by using various kinds of organic pigment 14, each of which has different particle diameter to one another. As apparent from Table 1, in each of the CD-R's, which is produced using the organic pigment 14 in which the particle diameter of the pigment particles is within a range according to the present invention, there are achieved good error rate, successive feeding property and playback performance.

TABLE 1

Influence of organic pigment particle diameter on performance of CD-R

| | Particle diameter | Error rate | Feeding property | Playback performance |
|---|---|---|---|---|
| Embodiment 1 | 425–500 μm | good | good | good |
| Embodiment 2 | 500–600 μm | good | good | good |
| Comparison 1 | unadjusted | wrong | wrong | wrong |
| Comparison 2 | 1–150 μm | wrong | wrong | wrong |
| Comparison 3 | 1000–1400 μm | good | wrong | wrong |

Hereinafter, the organic pigment feeder 28 for feeding the powder organic pigment 14 onto the belt 13 at a constant flow rate will be further described in detail.

Figure 7:
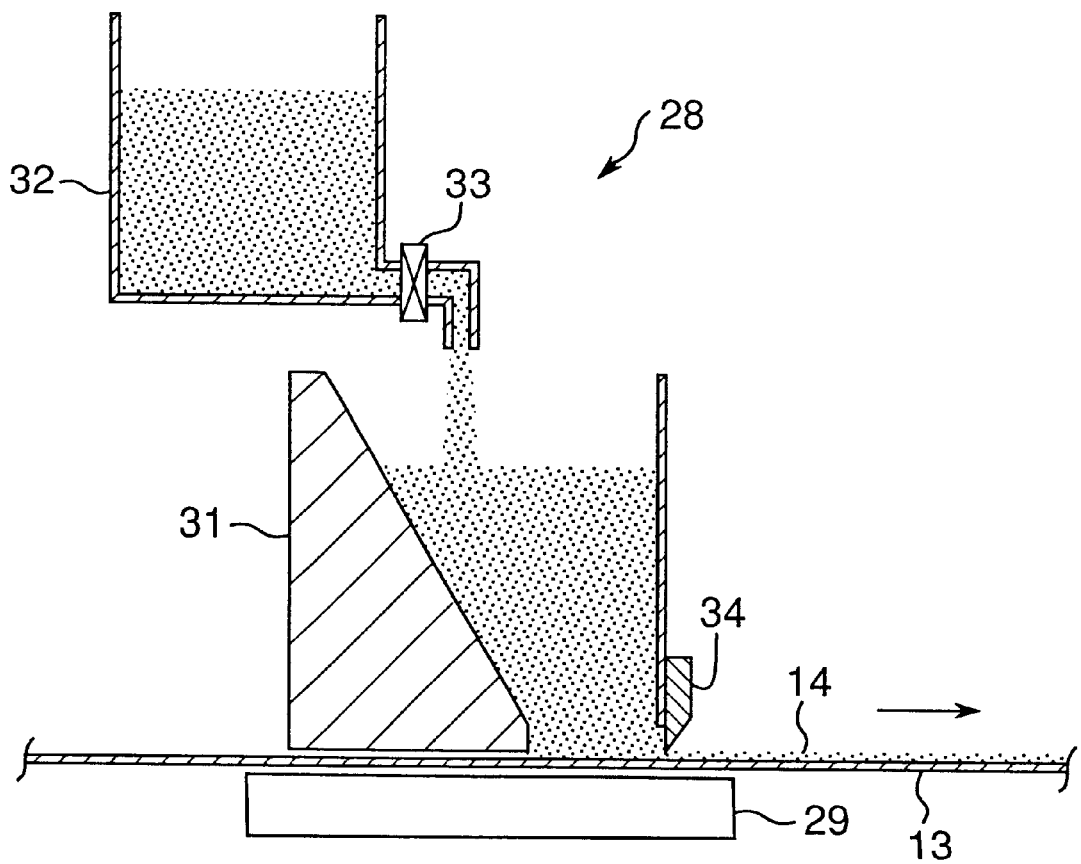
FIG. 7 is a sectional elevation view of an organic pigment feeding device provided in the pigment depositing device shown in FIG. 6.

As shown in FIG. 7, the organic pigment feeder 28 is provided with a main hopper 31 of comparatively small volume (for example, 100 cc) for arranging the organic pigment 14 of constant width and thickness on the upper spreading surface of the belt 13, and a sub hopper 32 of comparatively large volume (for example, 500 to 1000 cc) for storing the organic pigment 14 while suitably feeding the organic pigment 14 to the main hopper 31. Thus, when a shutter valve 33 mounted to the sub hopper 32 is opened, the organic pigment 14 in the sub hopper 32 flows down to the main hopper 31.

Hereupon, the main hopper 31 is provided with a thickness adjusting slit 34 and a width adjusting slit (not shown), for adjusting the thickness and width of the organic pigment 14 fed from the main hopper 31 to the belt 13, respectively, namely the flow rate of the organic pigment 14 to the belt 13. Thus, the organic pigment 14, whose thickness corresponds to the interval between the lower end (apex end) of the thickness adjusting slit 34 and the spreading surface of the belt 13, is fed to the spreading surface of the belt 13. Therefore, the thickness of the organic pigment 14 on the belt 13, namely the feeding rate of the organic pigment 14, can be set to a desired value by moving the thickness adjusting slit 34 upward or downward.

As described above, since the diameter of each of the particles of the powder organic pigment 14 is uniform, the fluidity of the organic pigment 14 is raised. Thus, in the main hopper 31 or the sub hopper 32, even if stirring using a screw or the like is not performed, the organic pigment 14 can flow very smoothly, in consequence the organic pigment 14 can be smoothly fed. Therefore, the construction or mechanism of the organic pigment feeder 28 may be simplified.

As shown in FIG. 4 again, after the recording layer 17 has been formed, the substrate 1 is transported to the reflecting layer forming chamber 7. Then, a metal material is deposited on the recording layer 17 by the metal depositing device 11 so that a reflecting layer 20 is formed (see FIG. 9A). Hereupon, since the metal depositing device 11 is a conventional metal depositing device which has been used in general, detailed description about that is omitted. In the reflecting layer forming step (Step S3), as the above-mentioned metal material, for example, there may be used a metal, whose reflectivity is larger, such as gold (Au), silver (Ag), aluminum (Al) or the like.

Hereupon, the reflecting layer 20 may be formed using a sputter device without using the above-mentioned metal depositing device 11.

After the recording layer 17 and the reflecting layer 20 have been formed on the obverse spreading surface of the substrate 1 as described above, a protecting layer is formed on the reflecting layer 20 (Step S4). Hereinafter, a concrete method of forming the protecting layer will be described.

As shown in FIG. 8A, in the protecting layer forming process, at first, an ultraviolet cure resin 21 is applied onto the reflecting layer 20 formed on the obverse spreading surface of the substrate 1 using an ultraviolet cure resin applicator 21 (Step T1).

Next, the substrate 1, in which the ultraviolet cure resin 22 has been applied on the reflecting layer 20, is rotated (self-rotation) about its center axis as indicated by an arrow $Y_1$, and then excess of the ultraviolet cure resin 22 is removed so that a layer of the ultraviolet cure resin 22 with approximately uniform thickness is formed on the reflecting layer 20 (Step T2). That is, the layer of the ultraviolet cure resin 22 is formed on the reflecting layer 20 by spin coating operation. The thickness of the layer of the ultraviolet cure resin 22 is as much as about 2 to 10 μm.

Figure 9A:
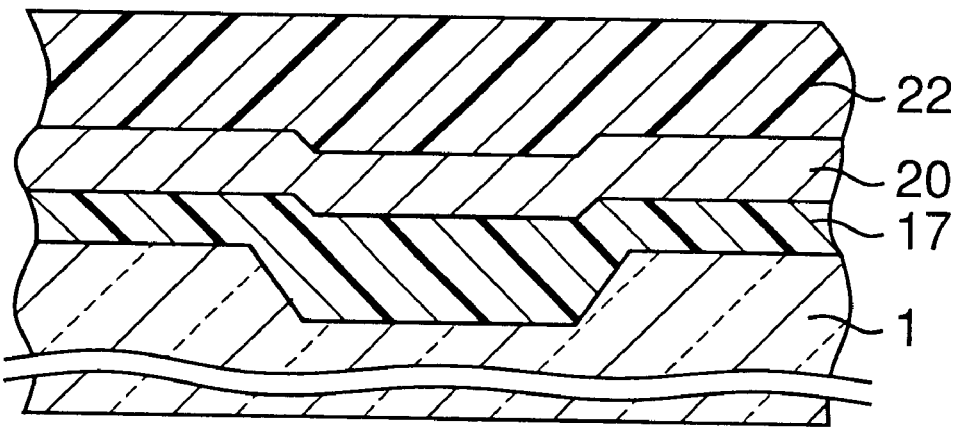
FIG. 9A is a sectional view showing a longitudinal section obtained by cutting the CD-R in the radial direction of the substrate after the protecting layer has been formed. 9B is a sectional view showing a longitudinal section obtained by cutting the DVD-R in the radial direction of the substrate after the covering substrate has been adhered.

Then, after the layer of the ultraviolet cure resin 22 has been formed on the reflecting layer 20 of the substrate 1, ultraviolet ray is applied onto the layer of the ultraviolet cure resin 22 from the obverse side of the substrate 1 (Step T3). Thus, as shown in FIG. 9A, the layer of the ultraviolet cure resin is cured to become a protecting layer 22.

After the protecting layer 22 has been formed as described above, an in-line examination is performed to the CD-R (Step S5). Hereupon, if the result of the examination is good, after-treatments such as printing, assembling, packing and so on are performed to the CD-R (Step S6), and then the CD-R is offered for sale.

Hereinafter, there will be described a method of or an apparatus for manufacturing a DVD-R (DVD of write-once type) according to the present invention. Hereupon, since the method of or apparatus for manufacturing the DVD-R is almost as same as the above-mentioned method of or apparatus for manufacturing the CD-R, difference between the present case and the above-mentioned case of manufacturing the CD-R will be principally described hereinafter in order to prevent duplicate descriptions.

As shown in FIG. 1B, in the manufacturing process of the DVD-R according to the present invention, as approximately same as the case of manufacturing the CD-R, a substrate 1 is produced by injection molding (Step S11), a recording layer 17 is formed on the obverse spreading surface of the substrate 1 (Step S12), and further a reflecting layer 20 is formed on the recording layer 17 (Step S13).

However, in the case of DVD-R, the thickness of the substrate 1 is set to as much as 0.6 mm, which is thinner than that of the CD-R (1.2 mm). The reason is that since a covering substrate 25 (see FIG. 9B) of about 0.6 mm thickness is adhered to the obverse side of the substrate 1 (reflecting layer 20) in the case of DVD-R as described after, it is necessary to do so for restricting the total thickness of the DVD-R to about 1.2 mm. Further, the track pitch is set to as much as 0.74 μm, which is smaller than that of the CD-R (1.6 μm).

In the case of manufacturing the DVD-R, after the recording layer 17 and the reflecting layer 20 have been formed on the obverse spreading surface of the substrate 1, an adhesive layer is formed on the reflecting layer 20 (Step S14), and then the covering substrate 25 (see FIG. 9B) is adhered onto the adhesive layer (Step S15). Hereinafter, the adhesive layer forming step and the covering substrate adhering step in the manufacturing process of the DVD-R will be concretely described.

As shown in FIG. 8B, in this case, at first, an adhesive 24 composed of ultraviolet cure resin is applied onto the reflecting layer 20 formed on the obverse spreading surface of the substrate 1 using an adhesive applicator 23 (Step T11).

Next, the covering substrate 25 is disposed on the obverse spreading surface (adhesive layer 24) of the substrate 1 (Step T12). Following that, the substrate 1 and the covering substrate 25, which are intimately adhered to each other through the adhesive layer 24, are rotated (self-rotation) about the center axis as indicated by an arrow $Y_2$, and then excess of the adhesive 24 is removed while the thickness of the adhesive layer 24 is adjusted. In consequence, the adhesive layer 24 of about 30 to 70 μm thickness is formed between the substrate 1 and the covering substrate 25 (Step T13).

Figure 9B:
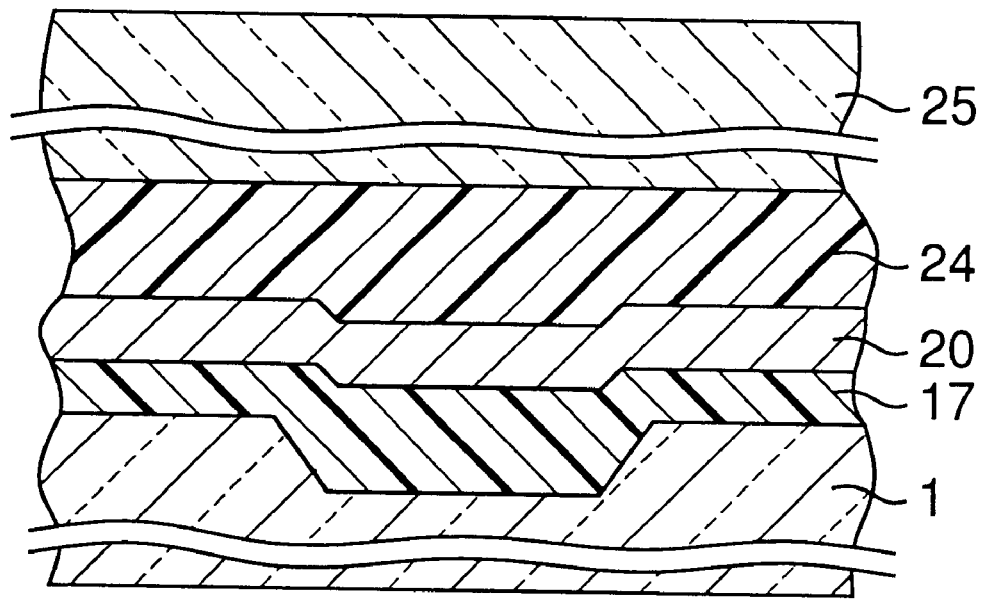

After the thickness of the adhesive layer 24 between the substrate 1 and the covering substrate 25 has been adjusted as described above, ultraviolet ray is applied onto the adhesive layer 24 from the side of the covering substrate 25 (Step T14). Thus, as shown in FIG. 9B, the adhesive layer 24 is cured so that the covering substrate 25 is adhered to the substrate 1 (the side of main body of the DVD-R).

After the covering substrate 25 has been adhered to the substrate 1 as described above, an in-line examination is performed to the DVD-R (Step S16). Hereupon, if the result of the examination is good, after-treatments such as printing, assembling, packing and so on are performed to the DVD-R (Step S17), and then the DVD-R is offered for sale.

As described above, according to the present invention, there may be prevented such a matter that when the recording layer of the optical recording medium is formed by vapor deposition using the powder organic pigment, the particles of the organic pigment adhere to the substrate. In consequence, the obtained optical recording medium may have a good error rate. Further, the organic pigment may be smoothly fed.

INDUSTRIAL APPLICABILITY

As described above, each of the method of and apparatus for manufacturing the optical recording medium according to the present invention is useful for a manufacturing procedure of a optical recording medium which is used as an external memory of a personal computer, word processor, large scale computer system or the like, and particularly it is suitable for a manufacturing process of compact disk of write-once type, DVD of write-once type or the like.

What is claimed is:

1. A method of manufacturing an optical recording medium, in which a recording layer for recording information in such a manner that the information can be read using light, is formed on a predetermined spreading surface of a disk-shaped substrate by depositing an organic pigment onto said spreading surface under an atmosphere of reduced pressure by vapor deposition, comprising the steps of:

heating the organic pigment in a powder state, in which a diameter of each of the particles of the pigment is within a range of 150 to 1000 μm to vaporize the organic pigment; and depositing vapor of the organic pigment onto said spreading surface of said substrate to form said recording layer.

2. The method of manufacturing the optical recording medium according to claim 1, wherein the diameter of each of the particles of the organic pigment of powder state is within a range of 30% upper or lower with respect to a standard particle diameter.

3. The method of manufacturing the optical recording medium according to claim 2, wherein said optical recording medium is an optical recording medium of write-once type to which the information can be written only once by applying light to said recording layer.

4. The method of manufacturing the optical recording medium according to claim 3, wherein said optical recording medium is a compact disk of write-once type or a DVD of write-once type.

5. The method of manufacturing the optical recording medium according to claim 1, wherein a ring-shaped belt is circulated in such a manner that an outer spreading surface of the belt orients upward in a partial region of a circulating path of the belt;

said organic pigment being fed onto said belt at a predetermined position, in a region where the outer spreading surface of said belt orients upward; and said organic pigment on said belt being heated to vaporize by feeding said organic pigment to a heating position while circulating said belt.

6. The method of manufacturing the optical recording medium according to claim 5, wherein said optical recording medium is an optical recording medium of write-once type to which the information can be written only once by applying light to said recording layer.

7. The method of manufacturing the optical recording medium according to claim 6, wherein said optical recording medium is a compact disk of write-once type or a DVD of write-once type.

8. The method of manufacturing the optical recording medium according to claim 1, wherein said optical recording medium is an optical recording medium of write-once type to which the information can be written only once by applying light to said recording layer.

9. The method of manufacturing the optical recording medium according to claim 8, wherein said optical recording medium is a compact disk of write-once type or a DVD of write-once type.

10. The method of manufacturing the optical recording medium according to claim 1, wherein said optical recording medium is an optical recording medium of write-once type to which the information can be written only once by applying light to said recording layer.

11. The method of manufacturing the optical recording medium according to claim 10, wherein said optical recording medium is a compact disk of write-once type or a DVD of write-once type.

* * * * *